United States Patent [19]
Chao

[11] Patent Number: 5,981,321
[45] Date of Patent: Nov. 9, 1999

[54] FORMING CMOS TRANSISTOR USING DIFFUSION SOURCE AND WET/DRY OXIDATION

[75] Inventor: Tien-Sheng Chao, Hsinchu, Taiwan

[73] Assignee: National Science Council, Taipei, Taiwan

[21] Appl. No.: 08/996,292

[22] Filed: Dec. 22, 1997

[30] Foreign Application Priority Data

Dec. 28, 1996 [TW]  Taiwan ................................. 85116198

[51] Int. Cl.$^6$ .............................................. H01L 21/8238
[52] U.S. Cl. ......................... 438/199; 438/229; 438/301; 438/588; 438/563; 438/564; 148/DIG. 30; 148/DIG. 123
[58] Field of Search ........................... 438/199, 301–229, 438/232, 563, 564, 588, FOR 168, FOR 187, FOR 216, FOR 217, FOR 218, FOR 320, FOR 321, FOR 322, FOR 323, FOR 324; 148/DIG. 123, DIG. 30

[56] References Cited

U.S. PATENT DOCUMENTS

| | | | |
|---|---|---|---|
| 5,162,245 | 11/1992 | Favreau ...................................... | 437/31 |
| 5,395,787 | 3/1995 | Lee et al. .................................... | 437/57 |
| 5,478,776 | 12/1995 | Luftman et al. ......................... | 437/163 |
| 5,710,054 | 1/1998 | Garden et al. ............................. | 437/44 |
| 5,856,226 | 1/1999 | Wu .......................................... | 438/291 |

FOREIGN PATENT DOCUMENTS

| | | | |
|---|---|---|---|
| 403070139 | 3/1981 | Japan ..................................... | 438/322 |
| 357196573 | 12/1982 | Japan ..................................... | 438/322 |
| 362051959 | 3/1986 | Japan ..................................... | 438/168 |

OTHER PUBLICATIONS

Liu, C. T., "MOSET's with . . . for ULSI Applications", IEEE Electron Device Letters, vol. 16, No. 8, Pages 363–365, Aug. 95.
Pfiester, J. R., "Reverse Elevated Source. . . Deep Submicron CMOS", IDEM, pp. 885–888, Apr. 1992.
Liu, c.T., "High–Performance CMOS. . . One–Mask Seald Diffusion–Junctions", IDEM, pp. 437–440, 93.

*Primary Examiner*—Wael M. Fahmy
*Assistant Examiner*—Long Pham
*Attorney, Agent, or Firm*—Fei-Fei Chao; Snider & Chao, LLP

[57] ABSTRACT

A method of forming shallow junctions in a CMOS transistor is disclosed. The method comprises the steps of: (a) forming a diffusion source layer on a N-well region, a P-well region, field oxide layer, and the gates of a CMOS transistor; (b) forming a photoresist layer over the P-well region; (c) carrying out p-type ion implantation to dope a part of the diffusion source layer on the P-well region; (d) removing the photoresist layer on the P-well region; (e) forming a photoresist layer over the N-well region; (f) carrying out n-type ion implantation to dope the other part of the diffusion source layer on the N-well region; (g) removing the photoresist layer on the N-well region; and (h) oxidizing the diffusion source layer and driving the ions therein into the P-well and N-well regions to form shallow junctions, respectively. The present invention has several advantages. First, it is compatible with the conventional CMOS process. Second, it does not require additional mask steps, therefore resulting in a simple process. Third, the CMOS transistors fabricated according to the present invention have shallow junctions, which can alleviate the short channel effect and the defects due to ion implantation.

16 Claims, 5 Drawing Sheets

FORMING CMOS TRANSISTOR USING DIFFUSION SOURCE AND WET/DRY OXIDATION

BACKGROUND OF THE INVENTION

1. Field of the Invention

The present invention relates to a method for forming a CMOS transistor, and more particularly, relates to a method for forming shallow junctions in a CMOS transistor.

2. Description of the Related Art

With advances in the semiconductor technology, the dimensions of the integrated circuit devices have shrunk to the deep sub-micron range. Some problems are incurred due to the process of scaling down. The most common problem is the short channel effect. In deep sub-micron CMOS technology, shallow junctions with low resistance values are required to alleviate or avoid the influences of short channel effect. However, based on experimental results, it is almost impossible to obtain a p-type junction of depth less than 500 Å via ion implantation. Therefore, other methods, such as the, solid state diffusion method or gas diffusion method, are used instead. In the solid state diffusion method, borosilicate glass (BSG) is commonly used as a p-type diffusion source.

FIG. 1A to FIG. 1D illustrate a process of fabricating shallow junctions in a COMS transistor by using BSG as a diffusion source. A semiconductor substrate 1 having an n-well region 2, a p-well region 3, and field oxide layer 4 is provided. Polysilicon gates 5 and 6 are also formed over the n-well region 2 and p-well region 3 respectively. First, a photoresist layer 7 is formed over the n-well region 2, and then arsenic ion implantation 8 is carried out to form n-type shallow junctions 9 in the p-well region 3, as shown in FIG. 1A. After removing the photoresist layer 7, an oxide layer 10 is deposited over the n-well region 2, p-well region 3, field oxide layer 4, and gates 5 and 6. The oxide layer 10 is partially etched such that only the portion over the p-well region 3 is reversed, as shown in FIG. 1B. Next, a BSG layer 11 is deposited and etched back, and the result is depicted in FIG. 1C. Finally, p-type ion implantation and n-type ion implantation are carried out to the n-well region 2 and the p-well region 3 respectively. Then, a thermal process is carried out to form source/drain regions 12, 13 in the CMOS transistor, as shown in FIG. 1D. During the thermal process, boron ions are diffused from the BSG layer 11 and thus form the shallow junctions 14 in the n-well region. In p-well region 3, because oxide layers 10 are formed between BSG layer 11 and p-well region 3, the n-type shallow junction 9 can be kept intact.

Although the above method can fabricate shallow junctions in a CMOS transistor, some drawbacks are inevitable. The formation of the BSG layer is by global deposition, and the n-type transistor not requiring p-type shallow junction must be protected by an oxide layer. Consequently, an additional mask is required to form the oxide layer. Otherwise, the n-type transistors must be fabricated first, followed by forming the p-type shallow junctions in p-type transistors via the solid-state diffusion method. However, this process is more complicated and costly.

SUMMARY OF THE INVENTION

Accordingly, an object of the present invention is to provide a method of forming shallow junctions in a CMOS transistor. The method is appropriate for deep sub-micron technology to provide a CMOS transistor with junctions of very shallow depth and of low resistance. In addition, the short channel effect can be alleviated.

The other object of the present invention is to provide a method of forming shallow junctions that is compatible with the conventional CMOS process, and simple enough to not require additional masks.

According to the present invention, the method of forming shallow junctions in a CMOS transistor comprises the following steps.

First, a semiconductor substrate is provided with an N-well region, a P-well region, field oxide layers, and gates formed in the P-well and the N-well regions.

(a) A polysilicon layer or amorphous silicon is formed as a diffusion source layer on the N-well region, P-well region, field oxide layer, and gates by using low-pressure chemical vapor deposition (LPCVD), for example. (b) A photoresist layer is formed over the P-well region. (c) P-type ion implantation is carried out to dope a part of the diffusion source layer on the N-well region, by using ions with energy of between 10 and 30 KeV, and a concentration of between $10^{14}$ and $10^{15}$, for example. (d) The photoresist layer on the P-well 10 region is removed. (e) A photoresist layer is formed over the N-well region. (f) n-type ion implantation is carried out to dope the other part of the diffusion source layer over the P-well region, by using ions such as arensic ions or phosphorus ions with energy of between 10 and 40 KeV, and a concentration of between $10^{14}$ and $10^{15}$, for example. (g) The photoresist layer on the N-well region is removed. (h) Finally, the diffusion source layer is oxidized and the ions therein are driven into the P-well and N-well regions to form shallow junctions respectively, by means of the wet oxidation method or dry oxidation method.

BRIEF DESCRIPTION OF THE DRAWINGS

Other objects, features and advantages of the present invention will become apparent by way of-the following detailed description of the preferred but non-limiting embodiment. Description is made with reference to the accompanying drawings.

DETAILED DESCRIPTIONS OF THE INVENTION

According to the present invention, the method of forming shallow junctions in a CMOS transistor comprises the following steps and will be described in detail with reference to FIG. 2A and FIG. 2B.

Figure 1A:
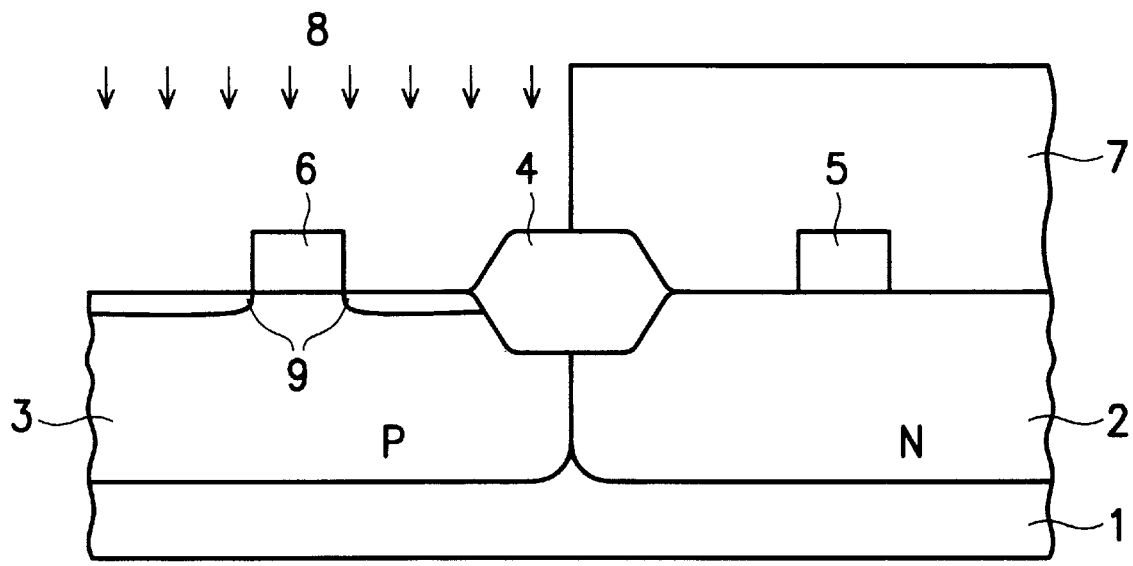
FIG. 1A to FIG. 1D illustrate a conventional method of fabricating CMOS shallow junctions by using BSG as a p-type diffusion source.
Figure 1B:
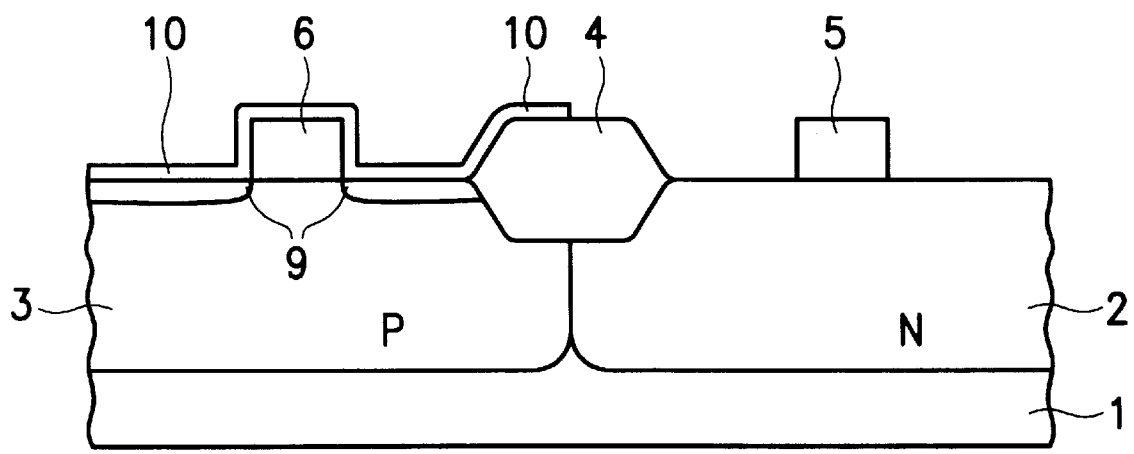
Figure 1C:
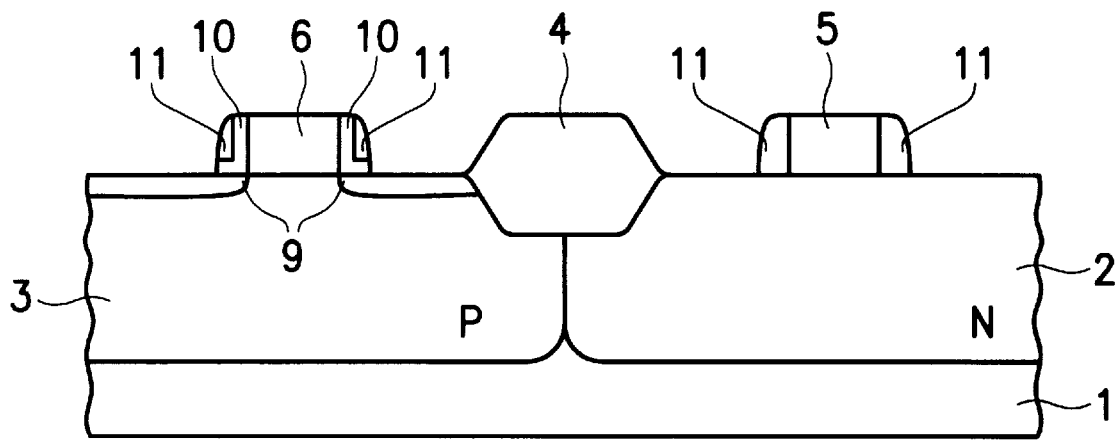
Figure 1D:
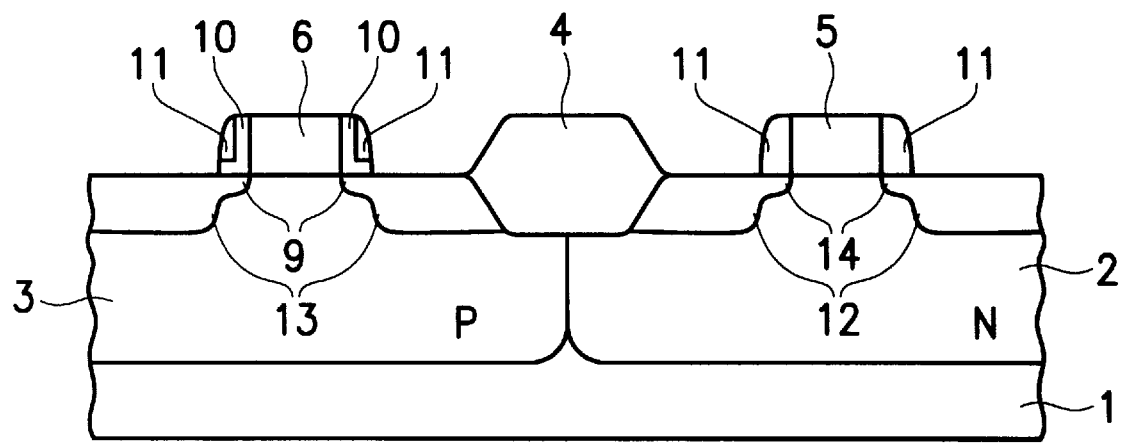
Figure 2A:
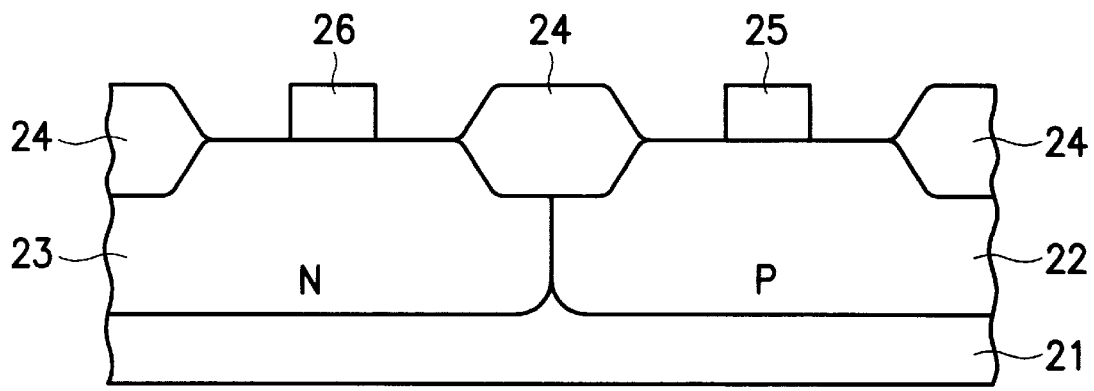
FIG. 2A to FIG. 2E illustrate a method of forming shallow junctions in a CMOS transistor according the present invention.
Figure 2B:
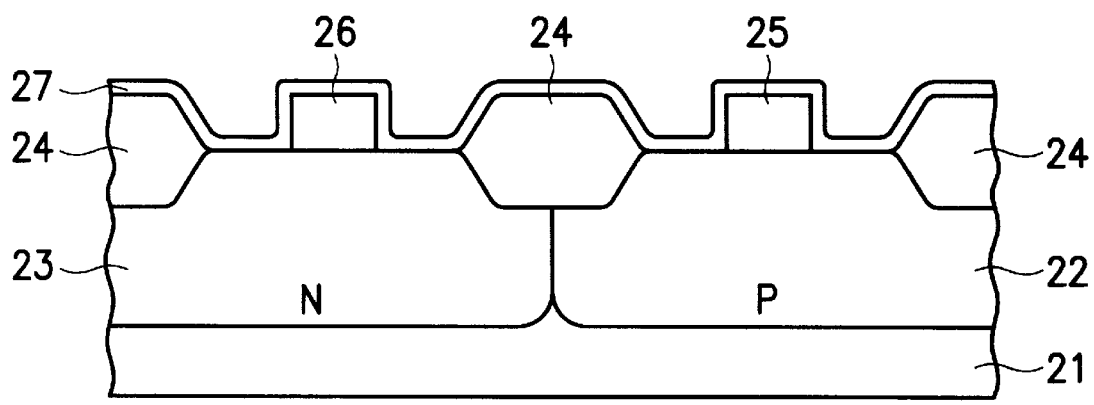

The method is carried out to a semiconductor substrate 21 with a p-well region 22, a N-well region 23, field oxide layer 24, and polysilicon gates 25, 26 formed in the P-well and N-well regions 25 and 26, as shown in FIG. 2A. Then, a polysilicon layer 27, with thickness of between 50 and 100 Å, is formed as a diffusion source layer over the p-well region 22, n-well region 23, field oxide layer 24, and polysilicon gates 25, 26 by using the LPCVD method, for example. The result is shown as FIG. 2B.

Figure 2C:
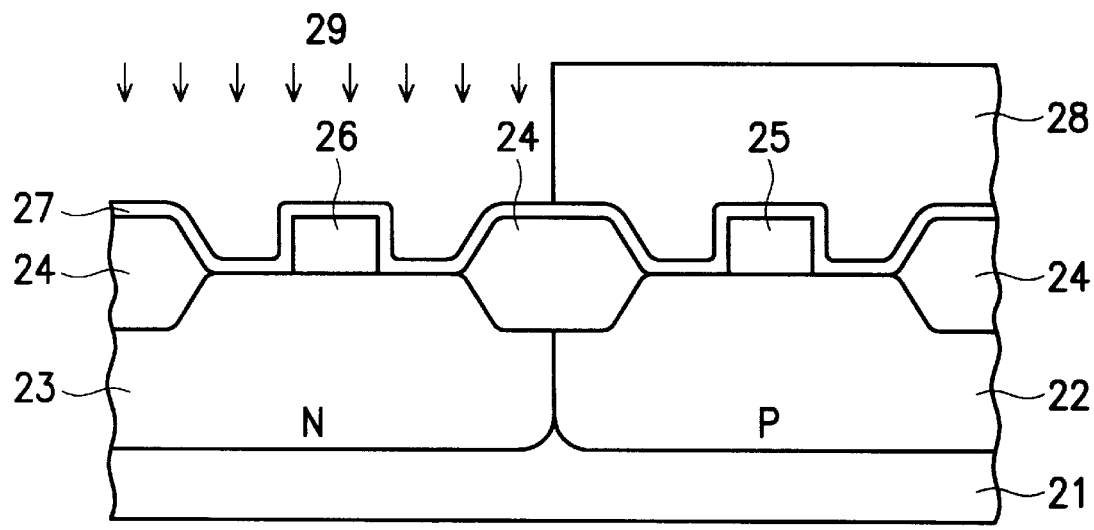

Referring to FIG. 2C, a photoresist layer 28 is formed over the P-well region 22 serving as an ion implantation mask. Then, p-type ion implantation 29 is carried out to dope a part of the diffusion source layer formed over the N-well region 23, by using boron ions with energy of between 10 and 30 KeV, and a concentration of between $10^{14}$ and $10^{15}$. Therefore, the diffusion layer formed over the n-well region 23 contains p-type ions.

Figure 2D:
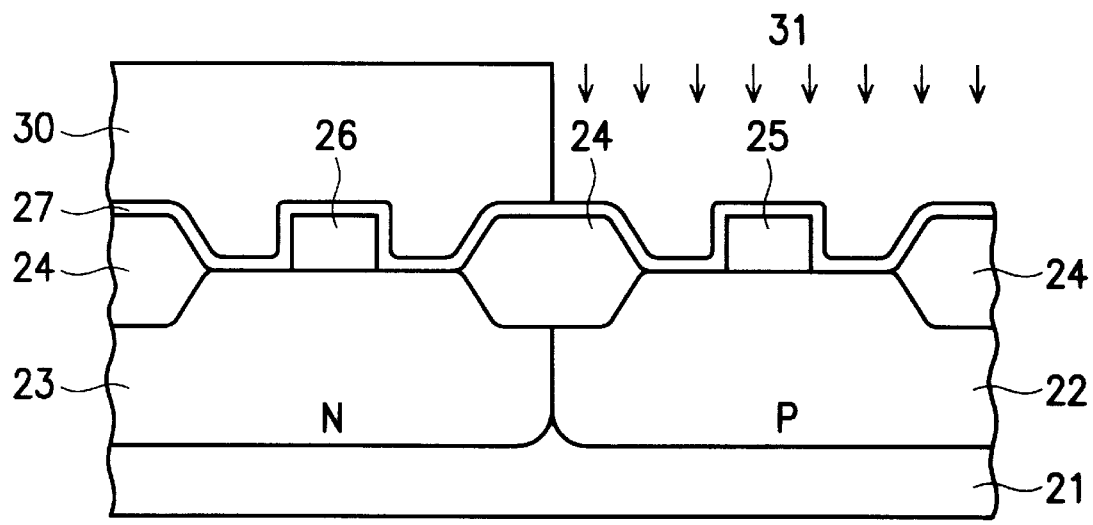

Next, referring to FIG. 2D, the photoresist layer 28 on the P-well region is removed. Another photoresist layer 30 is formed over the N-well region 23. N-type ion implantation 31 is carried out to dope the other part of the diffusion source layer over the P-well region 22, by using arsenic ions or phosphorus ions with energy of between 10 and 40 KeV, and a concentration of between $10^{14}$ and $10^{15}$. Therefore, the diffusion layer formed over the p-well region 22 contains n-type ions.

Figure 2E:
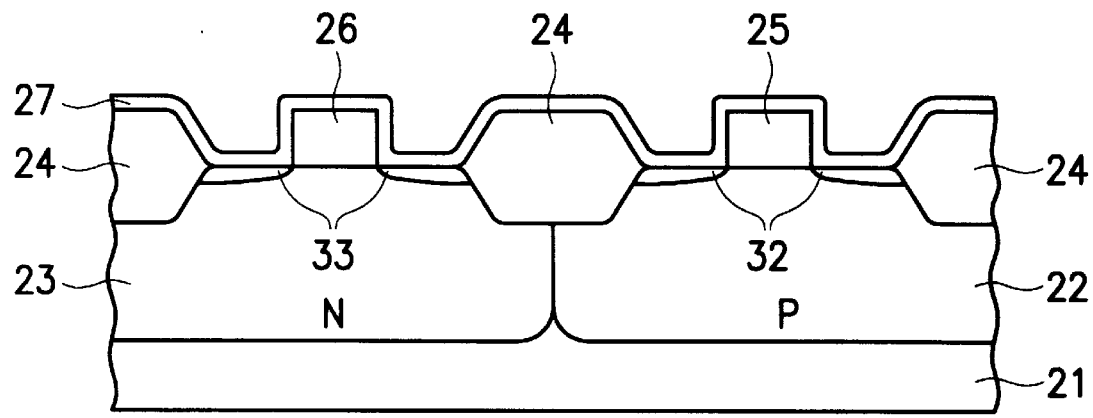

The photoresist layer 30 on the N-well region 23 is removed. Finally, the diffusion source layer is oxidized by means of the wet oxidation method or dry oxidation method. The n-type and p-type ions contained in the diffusion layer are driven into the p-well region 22 and n-well region 23 respectively to form n-type shallow junctions 32 and p-type shallow junctions 33, as shown in FIG. 2E.

Figure 3:
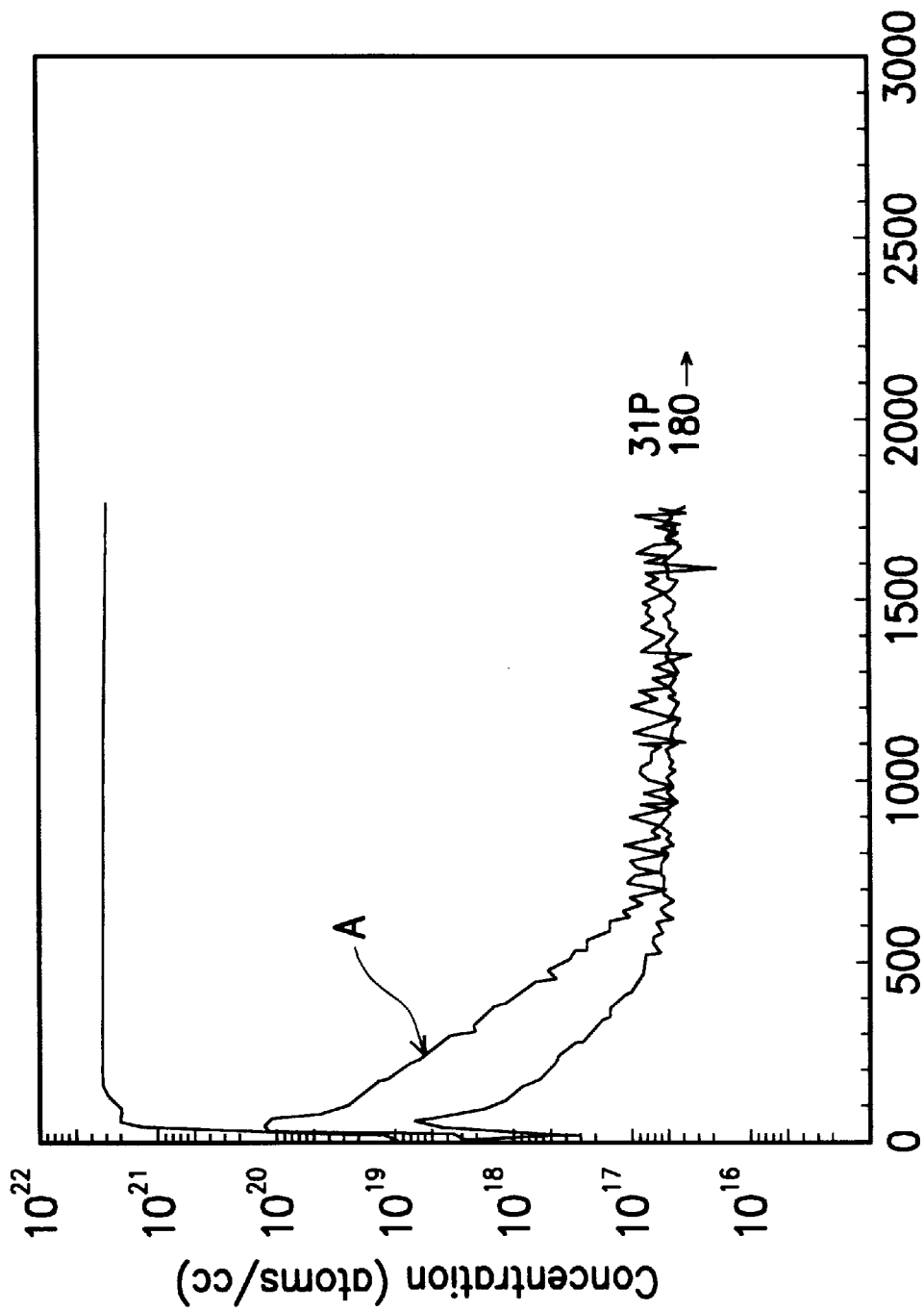
FIG. 3 illustrates an experimental result according to the present invention.

FIG. 3 illustrates an experimental result. In FIG. 3, the transverse coordinates show the depth of the junctions, and the longitudinal coordinates show the concentration of the junction. The concentration of the junctions gradually decreases from the surface of the junction, and the deeper the depth, the lighter the concentration. In general, the junction depth is defined as the distance measured from the junction surface to the position- where the concentration is about $10^{18}$ in the junction. From the curve A depicted in FIG. 3, the depth of the n+/p junction is between 400 Å and 500 Å.

Table I illustrates the expected progress and specifications of semiconductor technology in the future.

TABLE I

| Year | 1995 | 1998 | 2001 | 2004 | 2007 | 2010 |
|---|---|---|---|---|---|---|
| Process ($\mu$m) | 0.35 | 0.25 | 0.18 | 0.13 | 0.1 | 0.07 $\mu$m |
| Power Source (V) | 3.3 | 2.5 | 1.8 | 1.5 | 1.2 | 0.9 |
| Junction depth (Å) | 700~1500 | 500~1200 | 300~800 | 200~600 | 150~450 | 100~300 |

From the experimental result and the table I shown above, it is quite obvious that the shallow junction formed according to the present invention not only can alleviate the short channel effect but also meet the technology requirements of the future year 2004. In addition, the present invention is simple and compatible with the conventional CMOS process. Consequently, the present invention can reduce manufacturing costs and improve the market ability of CMOS transistors.

While the invention has been described in terms of what is presently considered to be one most practical and preferred embodiment, it is to be understood that the invention need not be limited to the disclosed embodiments. On the contrary, it is intended to cover various modifications and similar arrangements included within the spirit and scope of the appended claims, the scope of which should be accorded the broadest interpretation so as to encompass all such modifications and similar structures.

What is claimed is:

1. A method of forming shallow junctions in a CMOS transistor, for a semiconductor substrate with an n-well region, a p-well region, a field oxide layer, and gates formed in said p-well and n-well regions, said method comprising the steps of:
   (a) forming a diffusion source layer on said n-well region, p-well region, field oxide layer, and gates;
   (b) forming a photoresist layer over said p-well region;
   (c) carrying out p-type ion implantation to dope a part of said diffusion source layer formed over said n-well region;
   (d) removing said photoresist layer over said p-well region;
   (e) forming a photoresist layer over said n-well region;
   (f) carrying out n-type ion implantation to dope the other part of said diffusion source layer formed over said p-well region;
   (g) removing said photoresist layer on said n-well region; and
   (h) oxidizing said diffusion source layer and driving ions therein into said p-well and n-well regions to form shallow junctions, respectively, wherein said diffusion source layer is oxidized by using a wet oxidation method at a temperature of between 800 and 900° C.

2. The method as claimed in claim 1, wherein said diffusion source layer is formed by using a low-pressure chemical vapor deposition method.

3. The method as claimed in claim 1, wherein said diffusion source layer is a polysilicon layer with a thickness of between 50 Å and 100 Å.

4. The method as claimed in claim 1, wherein said diffusion source layer is an amorphous silicon layer with a thickness of between 50 Å and 100 Å.

5. The method as claimed in claim 1, wherein said p-type ion implantation is carried out by using boron ions with an energy of between 10 KeV and 30 KeV, and a concentration of between $10^{14}$ and $10^{15}$.

6. The method as claimed in claim 1, wherein said n-type ion implantation is carried out by using arsenic ions with an energy of between 10 KeV and 40 KeV, and a concentration of between $10^{14}$ and $10^{15}$.

7. The method as claimed in claim 1, wherein said n-type ion implantation is carried out by using phosphorus ions with an energy of between 10 KeV and 40 KeV, and a concentration of between $10^{14}$ and $10^{15}$.

8. The method as claimed in claim 1, wherein the steps (e), (f), and (g) can be carried out first, and then the steps (b), (c), and (d) follow.

9. A method of forming shallow junctions in a CMOS transistor, for a semiconductor substrate with an n-well region, a p-well region, a field oxide layer, and gates formed in said p-well and n-well regions, said method comprising the steps of:
   (a) forming a diffusion source layer on said n-well region, p-well region, field oxide layer, and gates;
   (b) forming a photoresist layer over said p-well region;
   (c) carrying out p-type ion implantation to dope a part of said diffusion source layer formed over said n-well region;
   (d) removing said photoresist layer over said p-well region;
   (e) forming a photoresist layer over said n-well region;
   (f) carrying out n-type ion implantation to dope the other part of said diffusion source layer formed over said p-well region;
   (g) removing said photoresist layer on said n-well region; and (h) oxidizing said diffusion source layer and driving ions therein into said p-well and n-well regions to form shallow junctions, respectively, wherein said diffusion source layer is oxidized by using a dry oxidation method at a temperature of between 800 and 900° C.

10. The method as claimed in claim 9, wherein said diffusion source layer is formed by using a low-pressure chemical vapor deposition method.

11. The method as claimed in claim 9, wherein said diffusion source layer is a polysilicon layer with a thickness of between 50 Å and 100 Å.

12. The method as claimed in claim 9, wherein said diffusion source layer is an amorphous silicon layer with a thickness of between 50 Å and 100 Å.

13. The method as claimed in claim 9, wherein said p-type ion implantation is carried out by suing boron ions with an energy of between 10'KeV and 30 KeV, and a concentration of between $10^{14}$ and $10^{15}$.

14. The method as claimed in claim 9, wherein said n-type ion implantation is carried out by using arsenic ions with an energy of between 16 KeV and 40 KeV, and a concentration of between $10^{14}$ and $10^{15}$.

15. The method as claimed in claim 9, wherein said n-type ion implantation is carried out by using phosphorus ions with an energy of between 10 KeV and 40 KeV, and a concentration of between $10^{14}$ and $10^{15}$.

16. The method as claimed in claim 9, wherein the steps (e), (f), and (g) can be carried out before the steps (b), (c), and (d).

* * * * *